United States Patent [19]
Ma

[11] Patent Number: 5,768,186
[45] Date of Patent: Jun. 16, 1998

[54] HIGH DENSITY SINGLE POLY METAL-GATE NON-VOLATILE MEMORY CELL

[76] Inventor: Yueh Yale Ma, 12471 Barley Hill, Los Altos Hills, Calif. 94024

[21] Appl. No.: 735,910

[22] Filed: Oct. 25, 1996

[51] Int. Cl.[6] ................................................. G11C 13/00
[52] U.S. Cl. ................................. 365/185.01; 365/185.05
[58] Field of Search ........................ 365/185.01, 185.05, 365/185.1, 185.26

[56] References Cited

U.S. PATENT DOCUMENTS 5,594,688  1/1997  Sato ................................... 365/185.01

Primary Examiner—Terrell W. Fears
Attorney, Agent, or Firm—Skjerven, Morrill, MacPherson, Franklin & Friel LLP; Alan H. MacPherson

[57] ABSTRACT

A high density single-poly metal-gate non-volatile memory cell uses a layer of tunnel oxide formed over a silicon substrate. A floating gate is formed over the tunnel oxide. Source and drain regions are ion implanted in the silicon substrate such that the source and drain regions are self-aligned to the corresponding edges of the floating gate. Following a high temperature anneal cycle which removes the defects in the source and drain regions, a composite layer of ONOP (Oxide-Nitride-Oxide-Polysilicon) coupling dielectric is formed over the floating gate. A metal, typically an aluminum alloy, forms the control gate of the memory cell on top of the composite layer of ONOP coupling dielectric.

19 Claims, 11 Drawing Sheets

| | CONTROL GATE | FLOATING GATE | DRAIN | SOURCE | SUBSTRATE |
|---|---|---|---|---|---|
| PROGRAMMING: | +12V | F | 6-7V | ØV | ØV |
| ERASE: | -12V | F | ØV | 6-7V | ØV |
| READ: | Vcc | F | 1-2V | ØV | ØV |

SPLIT-GATE CELL

| | CONTROL GATE | FLOATING GATE | DRAIN | SOURCE | SUBSTRATE |
|---|---|---|---|---|---|
| PROGRAMMING: | 12V | F | 6V-7V | 0 | 0 |
| ERASE: | -12V | F | 6V-7V | 0 | 0 |
| READ: | Vcc | F | 1-2V | 0 | 0 |

METAL-GATE IMPLEMENTATION
OF THE SPLIT-GATE CELL

DOUBLE-POLY SOURCE SIDE
INJECTION CELL

|  | CONTROL GATE | FLOATING GATE | DRAIN | SOURCE | SUBSTRATE |
|---|---|---|---|---|---|
| PROGRAMMING: | $V_t +.5$ | F | 12V | ØV | ØV |
| ERASE: | +12V | F | ØV | ØV | ØV |
| READ: | Vcc | F | ØV | 1-2V | ØV |

METAL-GATE IMPLEMENTATION
OF THE DOUBLE POLY SOURCE
SIDE INJECTION CELL

TRIPLE POLY SOURCE-SIDE
INJECTION CELL

|  | CONTROL GATE | FLOATING GATE | SELECT GATE | DRAIN | SOURCE | SUBSTRATE |
|---|---|---|---|---|---|---|
| PROGRAMMING: | 12V | F | 1-2V | 6-7V | ØV | ØV |
| ERASE: | -12V | F | ØV | 6-7V | ØV | ØV |
| READ: | Vcc | F | Vcc | 1-2V | ØV | ØV |

METAL-GATE IMPLEMENTATION
OF THE TRIPLE POLY SOURCE-SIDE
INJECTION CELL

DINOR CELL

|  | CONTROL GATE | FLOATING GATE | DRAIN | SOURCE | SUBSTRATE |
|---|---|---|---|---|---|
| PROGRAMMING: | -9V | FLOAT | 5V | FLOAT | 0V |
| ERASE: | 10V | FLOAT | FLOAT | -9V | -9V |
| READ: | 3V | FLOAT | 1.5V | 0V | 0V |

METAL-GATE IMPLEMENTATION OF THE DINOR CELL

HIGH DENSITY SINGLE POLY METAL-GATE NON-VOLATILE MEMORY CELL

FIELD OF THE INVENTION

The present invention relates in general to non-volatile semiconductor memory technology and more particularly to a structure of and a method for producing a non-volatile memory cell having a single polysilicon layer used as the floating gate and a metal layer used as the control gate.

DESCRIPTION OF THE RELATED ART

Conventional non-volatile semiconductor memory cell technologies, which use polysilicon floating gate as the storage element, typically comprise two or three layers of polysilicon. FIG. 1 shows the cross section of a conventional double-poly ETOX non-volatile memory cell. The first polysilicon layer 10, commonly referred to as the floating gate, is used as the storage element. As shown in FIG. 1, the floating gate 10 is encompassed on top by an ONO (Oxide-Nitrate-Oxide) coupling dielectric layer 11 and on bottom by a tunnel oxide dielectric layer 12, typically around 100Å thick.

The second polysilicon layer 13 is used as the control gate of the memory cell. When a number of memory cells are placed next to one another along one row in a memory array, the second polysilicon layer 13 forms a continuous line, commonly referred to as a wordline. As shown in FIG. 1, n+ source region 14 and n+ drain region 15 are formed in a P-type substrate 18 through an Arsenic implant step.

Metal 1 layer 16 contacts the source region 14 and the drain region 15, and is usually isolated from the control gate 13 by a thick BPSG insulating layer 17. Importantly, source region 14 and drain region 15 are self-aligned to the edge of the double polysilicon stack. This feature enables scaling of the ETOX cell with minimal complexity. This self-aligned feature is achieved by carrying out the source/drain implant after the formation of the stack of control gate 13 and floating gate 10.

With the advent of sub-micron technology and the rapidly increasing memory sizes, and the development of systems-on-chip, a number of limitations have arisen, to which no viable solutions have yet been offered.

One of these limitations is the long wordline RC time delays associated with large memory arrays. As mentioned earlier, in non-volatile memory arrays the second layer polysilicon forms the wordline. The high resistance and capacitance associated with second layer polysilicon results in what is known as the wordline RC time delay. With memory devices rapidly increasing in size, the memory arrays have become quite large. This, coupled with the continued scaling of semiconductor memory technology, has resulted in memory arrays with very long and thin polysilicon wordlines, which in turn have resulted in long RC time delays. The RC time delay, which is in the critical speed path of most memory devices, has become a limiting factor in achieving satisfactory memory device access times.

A number of approaches have been used to minimize the wordline RC time delay. One scheme breaks wordlines in half and drives the first half by a row decoder and the second half by a repeater. Each wordline requires one repeater and each repeater consists of two serially connected inverters. Given that two serially connected inverters need to be laid-out within the small pitch of a wordline, even the most efficient layout leads to repeaters excess die area. Therefore, repeaters, though effective in reducing the wordline RC delay, consume a large portion of the die area.

A second approach uses of tungsten silicide. Tungsten silicide reduces the resistance of the wordline RC by a factor of 10 as compared to polysilicon. However, with the rapid increase in memory sizes over the past decade, silicide is no longer an effective means of reducing the RC time delay.

A third and more effective approach in minimizing the wordline RC delay has been strapping the polysilicon wordline with a metal layer. Due to the very low resistance of metal, strapping the polysilicon effectively shorts the polysilicon wordline, thereby significantly reducing the resistance of the wordline RC. However, in order to strap the poly wordline with metal, contact holes need to be made between the metal and the polysilicon. Since the wordline pitch is usually the tightest pitch, such contact holes increase the wordline pitch and thereby result in significant loss of silicon area. In addition, the metal strap extending across the thin polysilicon wordline overlays a very rough topography caused by the double polysilicon stack. This has been the source of significant yield loss in mass producing non-volatile memories. Therefore, here again the speed improvements are at the cost of a larger die size and yield loss.

None of the above approaches offer an effective solution in minimizing the wordline RC time delay without any significant drawbacks.

A second impairing limitation involves some of the complexities arising in integrating different technologies. A general trend in the semiconductor industry has been integrating more functions into one chip, thereby replacing a number of discrete devices with one device. To enable such integration, combining different technologies such as SRAM, non-volatile and standard CMOS logic into one single process has become necessary. However, combining these technologies into a single process have proven difficult and complex. Standard CMOS logic technology and non-volatile memory technology have in fact been combined at the expense of a complex process.

One example of complexities arising in combining technologies is the classic case of combining SRAM technology using four transistor memory cells and non-volatile memory technology into a single process, a much favored trend in designing microcontrollers. The four transistor SRAM cell requires the use of a highly resistive polysilicon as the load element. In contrast, the non-volatile memory technology requires low resistive polysilicon to minimize such speed impediments as poly interconnect delay, gate resistance, the wordline resistance. Therefore, two conflicting characteristics are required of the polysilicon. Some memory manufacturers have adopted a singly poly non-volatile cell approach to overcome this limitation. However, the size of a single poly cell is typically three to four times larger than the conventional double poly cell. With no viable solution being offered, the development of cost effective products such as flash/SRAM IC devices has been hindered.

Theoretically, using metal as the control gate of the memory cell instead of polysilicon would overcome the above two mentioned limitations. The RC time delay limitation is overcome without any area penalty since the wordlines would be formed directly from metal, and as such no contact holes for strapping the wordlines would be needed. With respect to the limitation arising in integration of SRAM and nonvolatile memory technologies, a highly resistive second layer poly can be used exclusively as the load element for the four transistor SRAM cell, while metal and first layer poly can be used as the control gate and the floating gate of the memory cell respectively, thereby, eliminating the above mentioned conflicting characteristics required of the second layer poly.

In the early days of the IC industry, when 5 μm lithography metal-gate technology was in use, metal gate MOS transistors were common. However, the practice of using metal as the gate electrode or control gate of MOS devices has long been abandoned. The primary reason for abandonment of this technology was the lack of scalability. Unlike the conventional poly gate technology which lends itself well to scaling, the metal gate technology did not.

As mentioned earlier, the scalability of the poly gate technology stems from the self-aligned feature of its fabrication process. More specifically, the source/drain regions are self-aligned to the poly control gate because the source/drain ion implant step is carried out after the deposition and patterning of the poly gate whereby, the edges of the poly control gate are used to define the portions of the boundaries of the source/drain regions which delineate the transistor channel region. Therefore, to achieve the self-aligned feature, the control gate needs to be formed prior to source/drain region formation. In the metal gate MOS technology however, the source/drain ion implant step could not be performed after the deposition and patterning of the metal control gate, and as such the source/drain regions were not self-aligned. Generally, in the MOS technology a thermal annealing step, at temperatures above 900° C., must be carried out after the source/drain implant step in order to activate the arsenic element and form defect free source/drain regions. Due to the high temperature of the anneal cycle, only refractory materials with high melting point (i.e. materials withstanding temperatures greater than 900° C.), such as tungsten polycide, can be used as the control gate. As a result, aluminum, the commonly used gate metal, due to its low melting point, could only be used if deposited after the thermal annealing step, leading to non-self-aligned source/drain regions.

As a result, the non-self-aligned and non-scalable metal gate MOS technology was abandoned.

SUMMARY

In accordance with the present invention, a high density single poly metal-gate (MG) non-volatile memory cell suitable for use in an array of such cells, as well as a method for producing such cells along with a MOS periphery transistor are disclosed.

The single poly MG non-volatile memory cell comprises:

a source region and a drain region formed in a silicon substrate, the source and drain regions being separated by a channel region;

a floating gate which is over but insulated from said channel region by a layer of tunnel oxide dielectric, wherein at least one of the edges of the floating gate is aligned with and used to define the corresponding edge of one of source and drain regions; and a control gate made from a metal which is over but insulated from said floating gate by a composite layer of, in the order from bottom to top, HTO (High Temperature Oxide)-Nitride-HTO-Polysilicon (ONOP) coupling dielectric, wherein prior to forming the control gate a high temperature anneal cycle is carried out to remove the defects of the source and drain regions.

The following outlines one set of process steps for producing single poly MG non-volatile memory cells along with MOS periphery transistors.

(a) Initially, a number of islands of field oxide are grown over a p-type silicon substrate having an array region and a periphery region, wherein the islands of field oxide are formed in the array region and are arranged along a first selected lines.

(b) A layer of tunnel oxide is formed over the array region and the periphery region.

(c) A layer of polysilicon material is deposited and then defined in the array region and the periphery region using a photoresist masking process, wherein the polysilicon in the array region is defined as a number of floating gates arranged along the first selected lines, the floating gates being separated along the first selected lines by the islands of field oxide. Upon completion of this step, the photoresist used in defining the polysilicon is left covering the floating gates and the polysilicon in the periphery region.

(d) Continuous buried bitlines are formed in the array region in the portion of the silicon substrate between the lines of floating gates, whereby the buried bitlines are self-aligned to the edges of the floating gates.

(e) After removing the photoresist from over the floating gates and the polysilicon in the periphery region, a high temperature anneal cycle is carried out.

(f) The polysilicon in the periphery region is defined as the gate electrode of the periphery MOS transistors.

(g) The source/drain regions of the periphery transistors are ion implanted to form LDD source and drain spacer regions in the underlying substrate.

(h) LDD spacers are formed at the sides of the floating gates in the array and the gate electrodes in the periphery region.

(i) The periphery region is ion implanted to form the source and drain regions of the periphery MOS transistors.

(j) A composite layer of, in the order from bottom to top, HTO (High Temperature Oxide)-Nitride-HTO-polysilicon (ONOP) coupling dielectric, is formed over the array region.

(K) Contact holes are formed in the periphery region as well as the array region.

(l) Metal (typically but not necessarily alloy) aluminum is deposited and defined in the array and the periphery regions, wherein the metal in the array region is defined as a number of control lines running over the floating gates in a direction perpendicular to said first selected line, and the metal in the periphery region is defined to be in contact with the source and drain regions of the periphery MOS transistors.

(m) The top buffer poly layer of the composite ONOP coupling dielectric is removed from those sections of the array region between the control lines.

One feature of the present invention is that the wordline RC delay is significantly reduced without any die area penalty since the wordlines are from metal.

Another feature of the present invention is that the source/drain regions of the memory cell are self-aligned to the edges of the floating gate.

Yet, another feature of the present invention is that the LDD oxide spacer is advantageously used in the array to provide for a smooth topography.

Yet another feature of the present invention is that in producing the memory cell and the periphery transistors, first layer polysilicon is used both as the floating gate in the array and as the gate electrodes for the MOS devices in the periphery.

Yet another feature of the present invention is that a buffer polysilicon layer is used over the ONO coupling dielectric as a protection layer for the ONO during the contact etch, thereby minimizing the yield loss caused by defects introduced into the ONO coupling dielectric during the processing steps.

All of the above features are achieved using a simple process in which CMOS transistors and the metal-gate non-volatile memory cells are easily integrated.

These and other features and advantages of the present invention will become more apparent from the following description and the accompanying drawings.

BRIEF DESCRIPTION OF THE DRAWINGS

FIG. 2b shows the cross section across line AA in FIG. 2a.

DETAILED DESCRIPTION OF THE PREFERRED EMBODIMENT

In accordance with the present invention, a high density single poly metal-gate non-volatile memory cell is disclosed. One cell structure and the process for fabricating a metal-gate memory cell of this invention, are described in more detail hereinafter. This description is illustrative only and not limiting.

Figure 1:
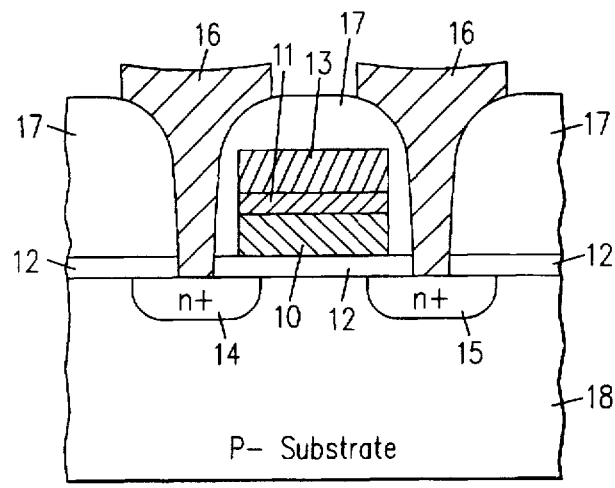
FIG. 1 shows the cross section of a conventional double-poly ETOX non-volatile memory cell.
Figure 2A:
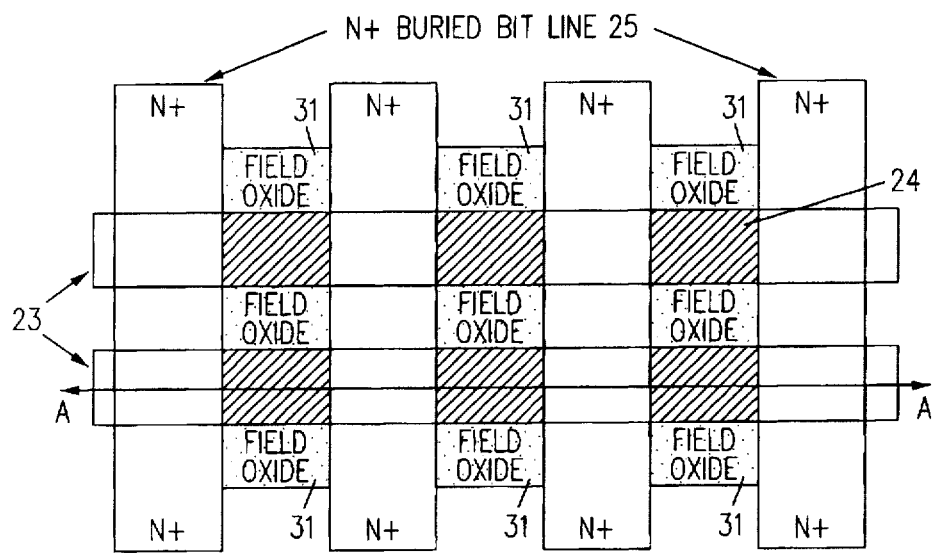
FIG. 2a shows a contact-less array in accordance with the present invention.
Figure 2B:
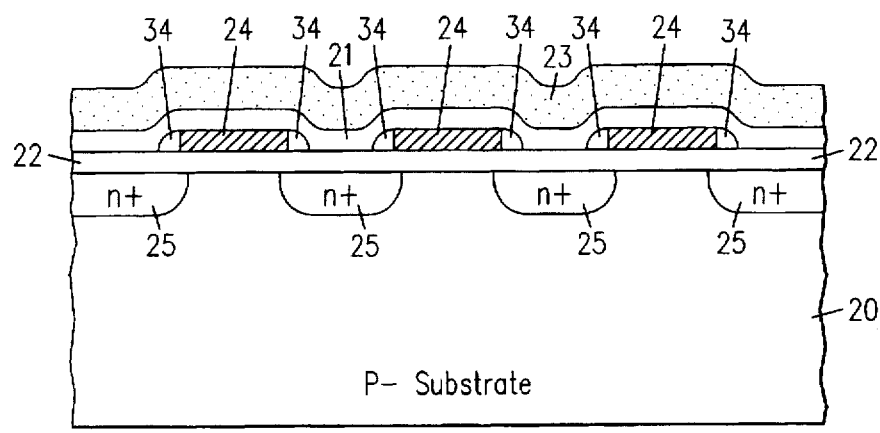

(a) Description of the cell structure of the metal-gate non-volatile memory cell in a contact-less array:

FIGS. 2a to 2b show a specific implementation of the present invention. FIG. 2a shows a contact-less array in accordance with the present invention. FIG. 2b shows the cross section at line AA in FIG. 2a.

As shown in FIG. 2a, floating gates 24 are arranged in columns. The floating gates 24 are separated along the vertical direction by field oxide regions 31 and along the horizontal direction by columns of continuous buried bitline 25. The portions of the columns of buried bitlines 25 that are adjacent to each floating gate 24 form the source/drain regions for each memory cell (this can also be seen in FIG. 2b).

In FIG. 2a, continuous metal lines 23 are shown to run over the floating gates 24 across the array in the horizontal direction. The portions of the metal lines 23 running over the floating gates 24 form the control gate for each memory cell. The metal lines 23 are also referred to as the wordlines. Note that since the wordlines are from metal, no wordline strapping, as in the conventional non-volatile memory arrays with polysilicon wordlines, is required.

Also shown in FIG. 2b are LDD (Lightly-Doped Drain) oxide spacers 34 formed at the edges of the control gates 24. The spacers provide a smoother array topography, resulting in better step coverage for the metal wordlines.

As shown in FIG. 2b, between the metal control gate 23 and the floating gate 24, an ONOP (Oxide-Nitride-Oxide-Polysilicon) composite layer 21 is used as the coupling dielectric. The ONOP composite coupling dielectric 21 consists of, in the order from bottom layer to top layer: 100Å of High Temperature Oxide (HTO), 100Å of nitride, 50Å of HTO, and 400Å of intrinsic polysilicon. The intrinsic polysilicon layer is un-doped and is primarily used as a buffer layer for protecting the ONO (HTO/nitride/HTO) layer from the subsequent processing steps.

Also shown in FIG. 2b is the tunnel oxide dielectric layer 22 insulating the floating gates from the underlying silicon substrate.

One key deviation from the conventional ETOX cell approach is that unlike the process steps in the conventional ETOX cell wherein the source/drain region anneal cycle is carried out <u>after</u> the formation of the control gate, the anneal cycle in the process of the present invention is carried out <u>prior to</u> the formation of the control gate, as will be described in more detail below. This change in the sequence of steps eliminates the concern about the low melting point of the aluminum gate during the high temperature anneal cycle.

A second key deviation from the conventional ETOX cell approach is that unlike the ETOX cell approach wherein the source/drain regions are self-aligned to the stack of control gate and floating gate, in the present invention the source/drain regions are self-aligned to the edge of the floating gate.

The above two deviations from the conventional ETOX cell approach has enabled the direct use of metal as the control gate of the memory cell while the scalability benefits resulting from a self-aligned source/drain process is maintained.

(b) Description of the process steps involved in fabrication of a single-poly metal-gate non-volatile memory cell:

FIGS. 3a to 3m show one embodiment of the present invention. These Figures depict the cross section of a memory device and a MOS periphery transistor at the different stages of the fabrication process. The cross section of a MOS transistor is incorporated in each Figure to illustrate the ease with which the metal-gate memory cell process can be integrated into a standard MOS process. The dimensions shown in these Figures are not to scale and are for illustration purposes only.

Figure 3A:
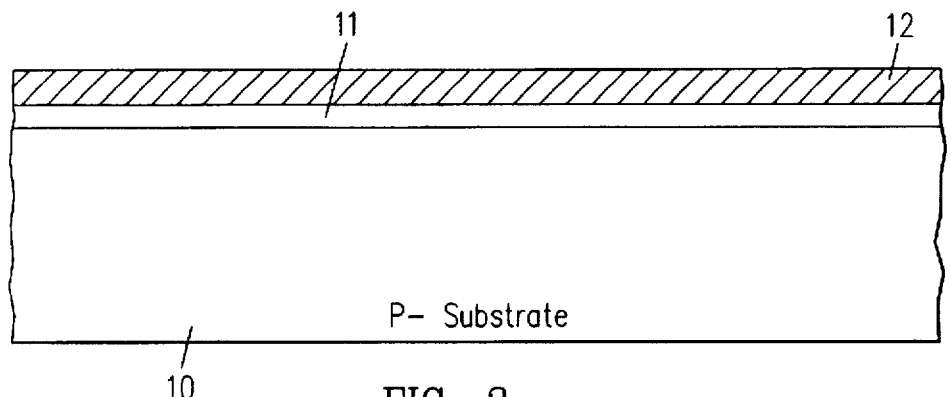
FIGS. 3a to 3m show the cross sections of a memory device and a MOS transistor at the different stages of the process sequence in accordance with one embodiment of the present invention.

Prior to the process step of FIG. 3a, islands of field oxide, each having a thickness of approximately 5000Å, shown as regions 31 in FIG. 2a, are grown over the silicon substrate. The field oxide 31 of FIG. 2a is not shown in FIGS. 3a to 3m because these figures show the cross section across line AA in FIG. 2a at different stages of the fabrication process.

FIG. 3a shows a P-type substrate 10 over which a thin layer of tunnel oxide 11, having a thickness in the range of 65Å to 100Å, is grown. Subsequently, a first layer of polysilicon or polycide 12, having a thickness in the range of 1500Å to 3000Å, is deposited over the tunnel oxide layer 11. The polysilicon layer 12 is then doped by Phosphor to make it n-type.

Figure 3B:
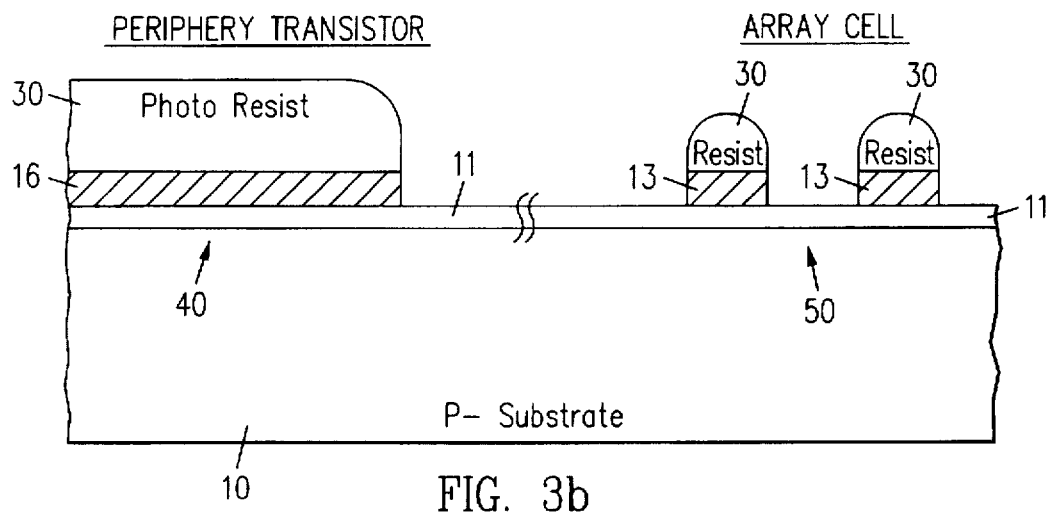

All the cross sections in the subsequent Figures show a periphery transistor in the periphery region 40 along side memory cells in the array region 50. In FIG. 3b, the floating gates 13 are defined through a photoresist masking step and a subsequent plasma etching step. The polysilicon portion 16 in FIG. 3b remains undefined. As shown in FIG. 3b, the photoresist 30, used in defining the polysilicon, is not removed from over the floating gates 13 and the polysilicon 16.

Figure 3C:
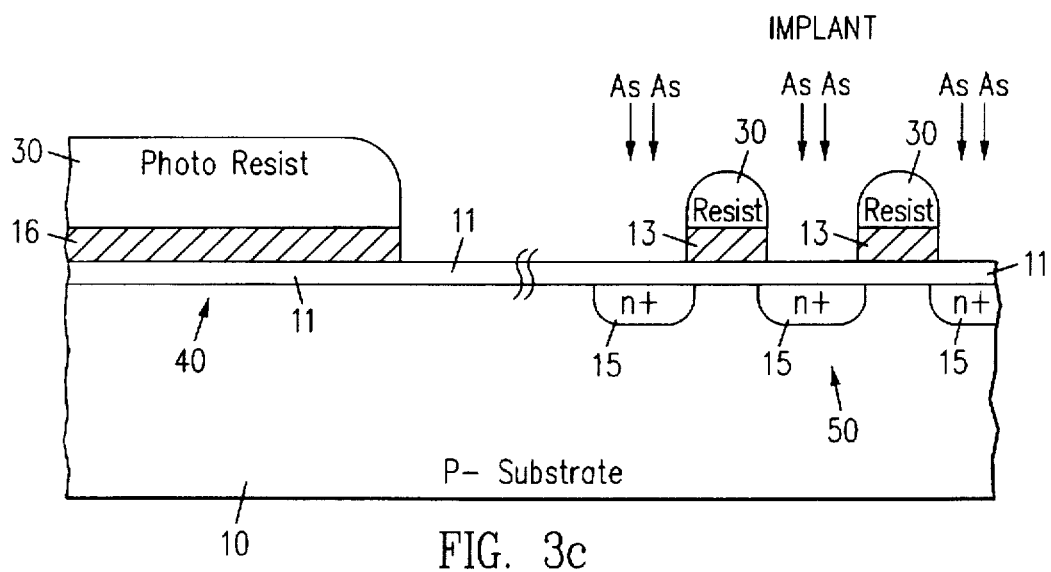

Next, as shown in FIG. 3c, an Arsenic implant step is carried out to form the source/drain regions 15 for the memory cells in the array region 50. Note that through this process step, the source and drain regions 15 become self-aligned to the edges of the floating gates 13.

With the floating gates 13 covered by photoresist 30 during the Arsenic implant step, the floating gates 13 are protected against any potential damage during the source/drain ion implantation. This helps improve the memory cell retention characteristics, a mechanism which leads to yield loss or loss of otherwise functional dice.

Figure 3D:
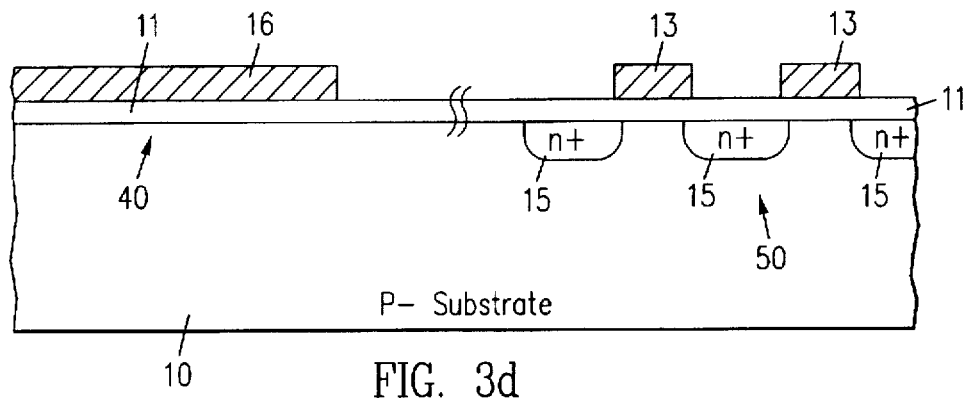

Next, as shown in FIG. 3d, the photoresist 30 is stripped and then a high temperature anneal cycle at approximately 900° C. is carried out in order to anneal out the defects of the source/drain regions 15. Note that the annealing of the source/drain regions 15 is carried out prior to the deposition and formation of the memory cell control gate.

Figure 3E:
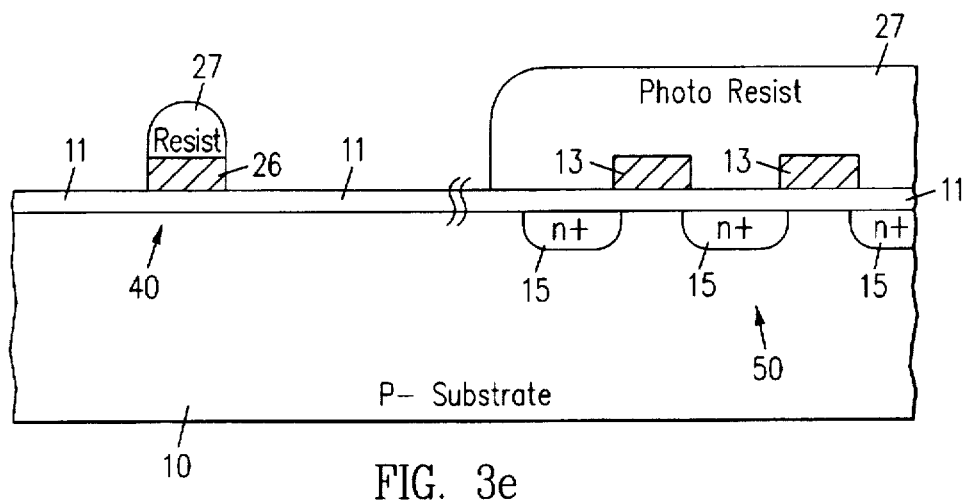

As shown in FIG. 3e, a photoresist masking step is carried out through which the gate electrode 26 of the periphery transistor in the periphery region 40 is defined while the entire array region 50 is covered and protected by photoresist 27.

Figure 3F:
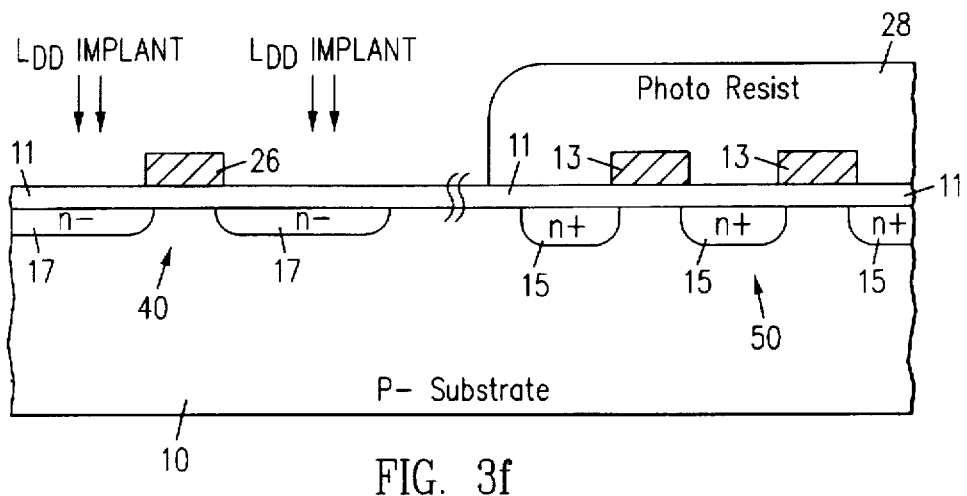

Subsequently, photoresist 27 is stripped from over both the gate electrode 26 and the memory cells. Through another photoresist masking step, the memory cells are covered by photoresist 28 while an implant step is carried out in the periphery region 40 to form Lightly-Doped Drain (LDD) n- regions 17, as shown in FIG. 3f.

Figure 3G:
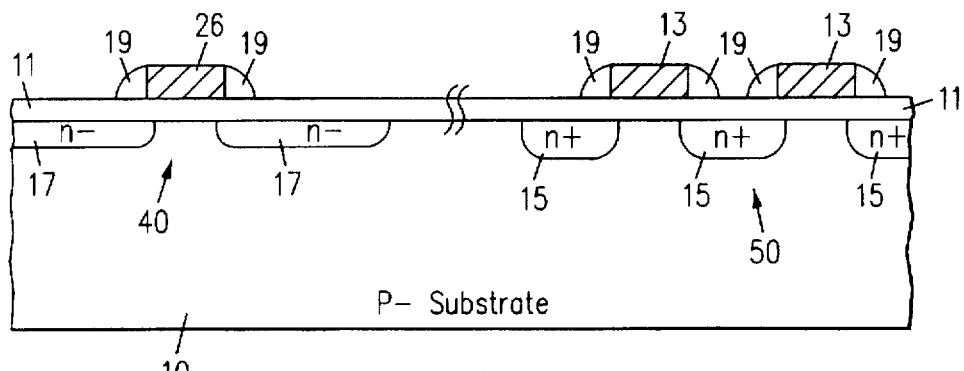

As shown in FIG. 3g, the photoresist 28 is stripped from over the memory cells, and an oxide spacer, preferably HTO, is deposited and subsequently etched back to form the LDD spacer 19 at the edges of the gate electrode 26 of the peripheral transistor as well as at the edges of the floating gates 13. Oxide spacers are commonly used in fabrication of peripheral LDD transistors, however, in the present invention oxide spacers are advantageously used in the array region 50 to provide a smoother array topography. A smoother array topography provides better step coverage for the metal wordlines to be deposited at a later process step.

Figure 3H:
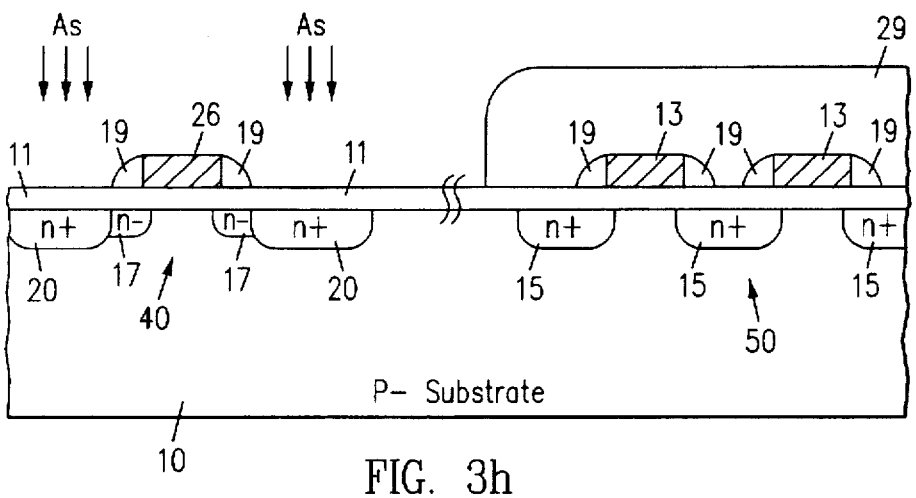

Next, as shown in FIG. 3h, an Arsenic implant step is carried out in the periphery region 40 to form the source/drain regions 20 of the peripheral transistor. During the implant cycle, the array region 50 is covered by an array mask 29 in order to protect the floating gates 13 from receiving the implant.

Figure 3I:
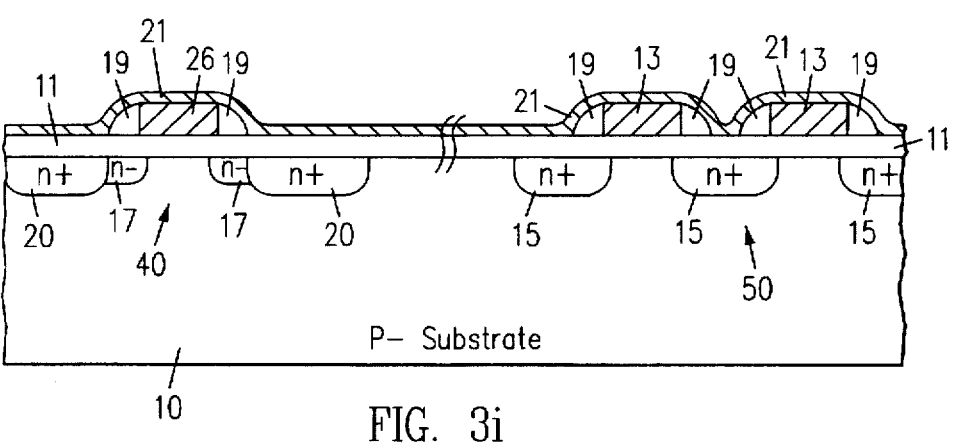

As shown in FIG. 3i, a composite layer of coupling dielectric Oxide-Nitride-Oxide-Polysilicon (ONOP) 21 is grown over the memory cells as well as the periphery transistor. The ONOP coupling dielectric 21 consists of, in the order from bottom layer to top layer: 100Å of HTO, 100Å of nitride, 50Å of HTO, and 400Å of intrinsic polysilicon. The intrinsic polysilicon layer is un-doped and is primarily used as a buffer layer for protecting the ONO (HTO/nitride/HTO) layer from the subsequent processing steps. The thickness of the intrinsic polysilicon buffer layer is in the range of 100Å to 400Å depending upon the back-end process.

Figure 3J:
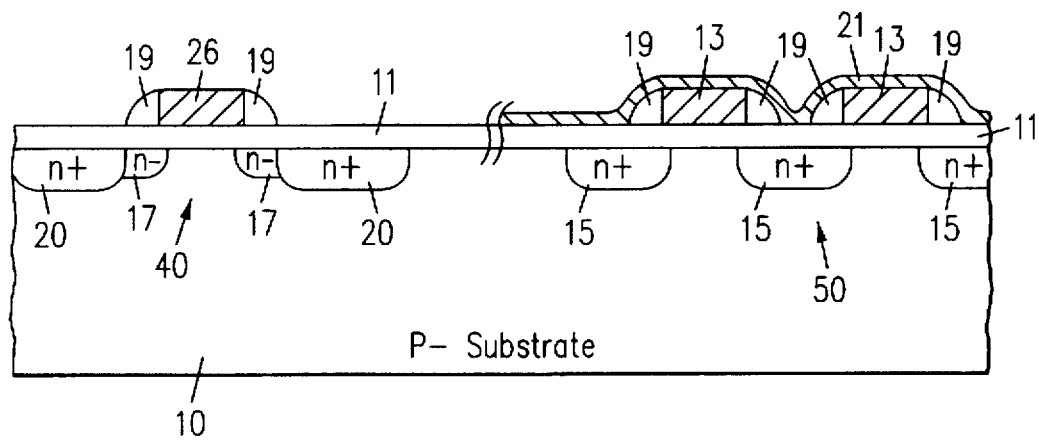
Figure 3K:
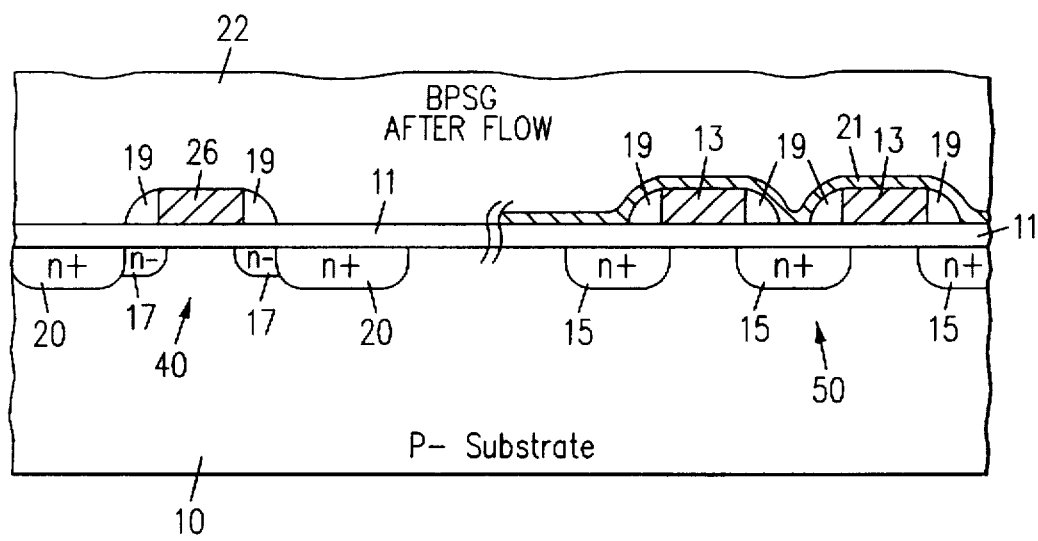

In FIG. 3j, the composite layer of ONOP coupling dielectric 21 is removed from over the peripheral transistor through a conventional photoresist masking and etching step. In FIG. 3k, an insulation layer of BPSG 22 is deposited and a BPSG flow process is subsequently carried out such that approximately 6000Å of BPSG is formed over the both the array region 50 and the periphery region 40.

Figure 3L:
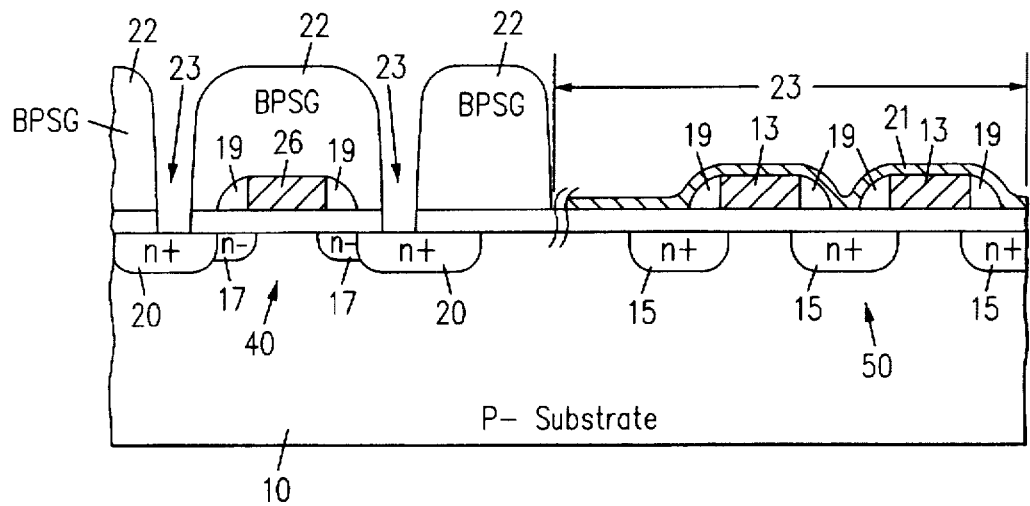

In FIG. 3l, contact holes 23 are formed using a contact mask. In forming the contact holes 23 in the periphery region 40, the BPSG layer 22 is etched all the way down to the silicon surface. This facilitates the later step of contacting the source/drain diffusion regions 20. In the array region 50, the whole memory array is opened as a big contact hole 23, and the BPSG layer 21 is etched down to the ONOP coupling dielectric layer 21, as shown in FIG. 3l. A high oxide to poly selectivity (greater than 30) of the dry plasma oxide etch is used during the contact etch. Therefore, given the 400Å thick buffer polysilicon layer, the ONO coupling dielectric underneath the buffer poly layer should sufficiently be protected from the BPSG contact etch.

Figure 3M:
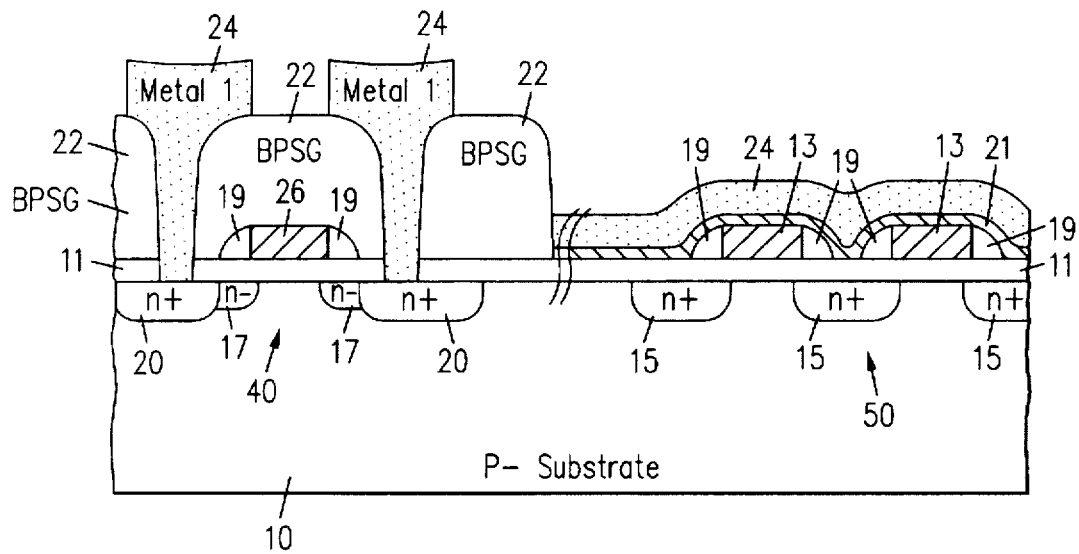

After the contact hole formation, the metal 1 layer 24 is deposited over the memory cells and the periphery transistor. Using a photoresist masking step, the deposited metal 1 layer 24 is then defined in the array region 50 as the control gate of the memory cells, and in the periphery region 40 as the interconnect for the periphery transistors. As mentioned earlier, the oxide spacer 19, adjacent to the floating gates 13, provides for a smooth step coverage of the metal wordlines 24 in the array as shown in FIG. 3m.

The portions of the buffer poly layer remaining exposed between adjacent metal wordlines (not shown in FIG. 3m) is then etched off through a plasma polysilicon etching step. This step is required in order to prevent leakage between metal wordlines through the buffer polysilicon. Finally, a conventional passivation layer (not shown) is deposited over the entire silicon die to protect the die from scratches or other damages.

FIGS. 4a to 4e show other embodiments of the present invention. In the upper section of each of these Figures, a commonly known non-volatile memory cell structure, along with its corresponding programming/erase/read logic table are shown. In the lower section of each of these Figures, the corresponding metal-gate implementation of the non-volatile memory cell is shown.

Figure 4A:
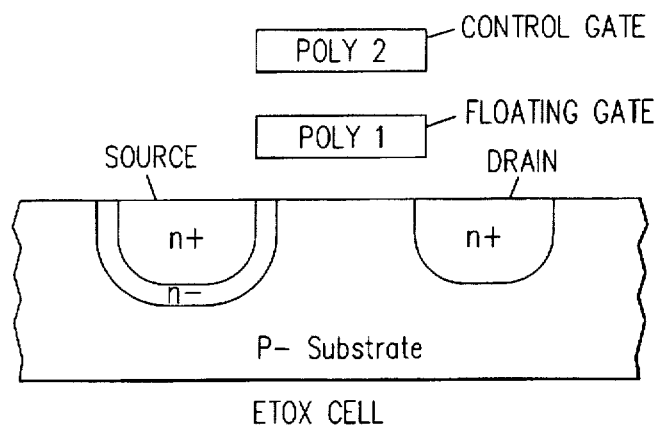
FIGS. 4a to 4e show five different memory cell approaches currently being produced and sold in the market, and the corresponding metal-gate implementation of each.
Figure 4A:
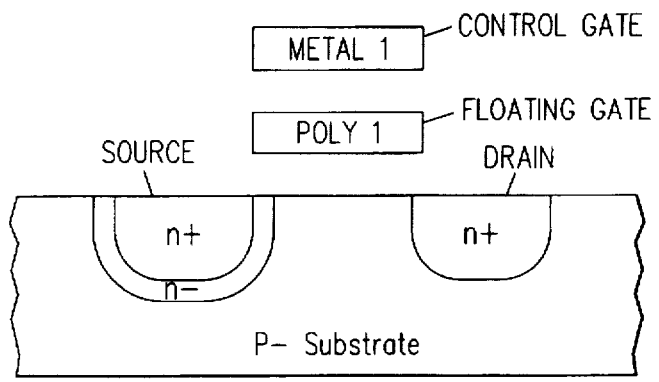
Figure 4B:
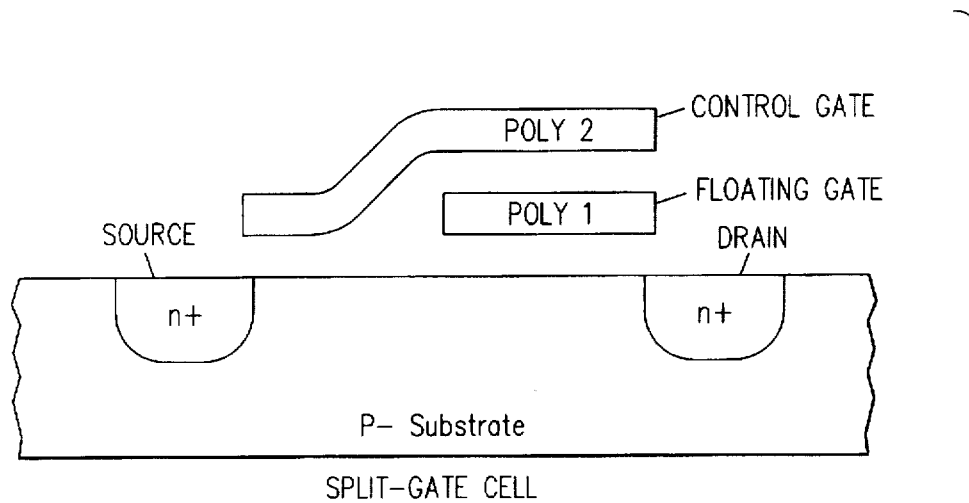
Figure 4B:
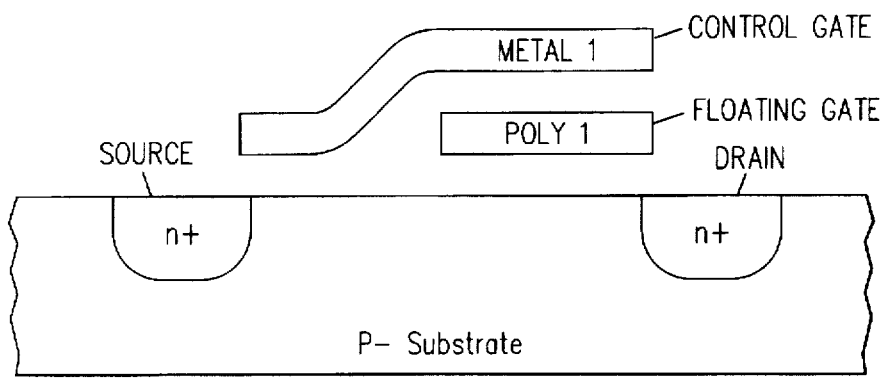
Figure 4C:
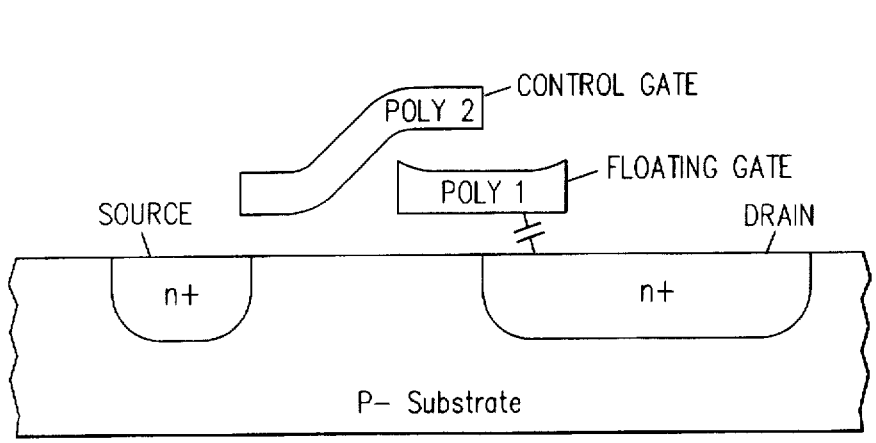
Figure 4C:
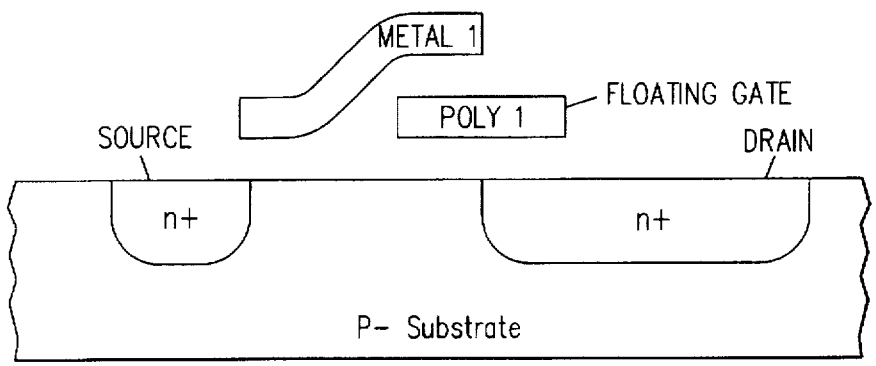
Figure 4D:
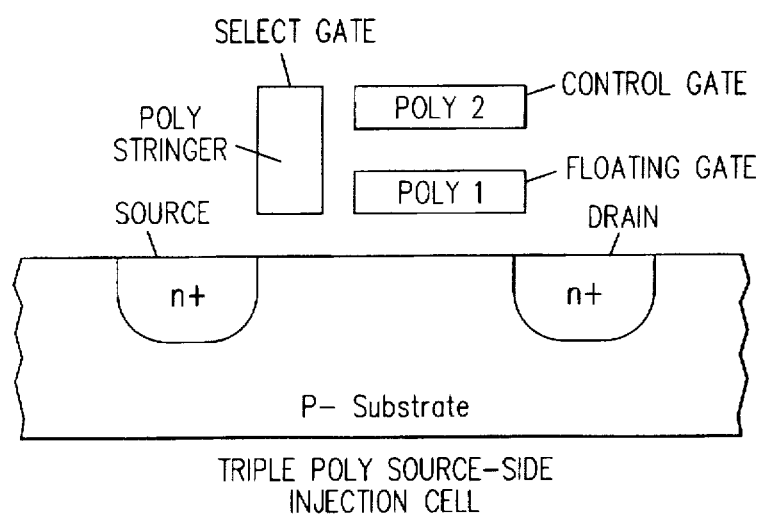
Figure 4D:
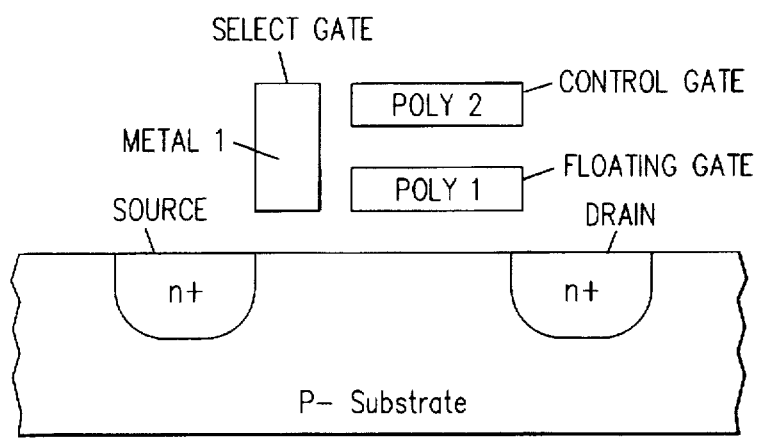
Figure 4E:
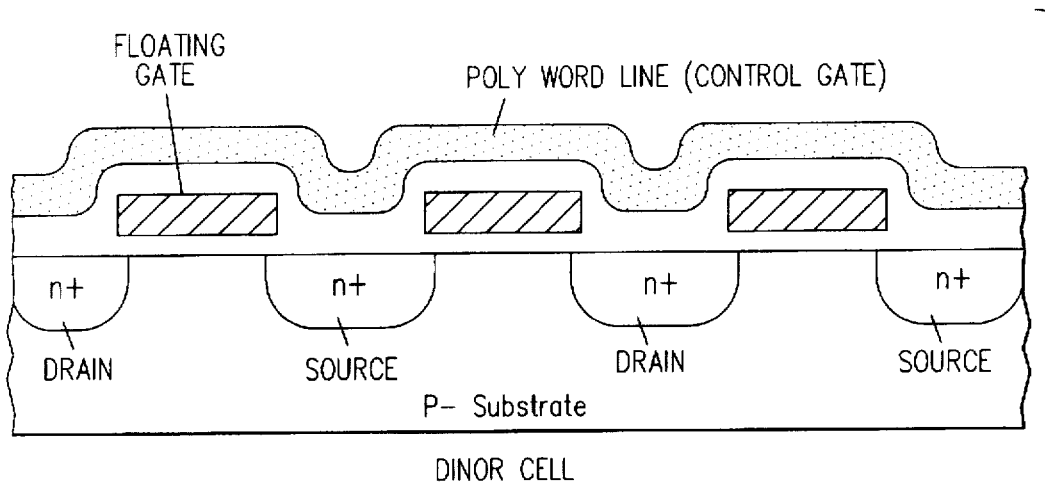
Figure 4E:
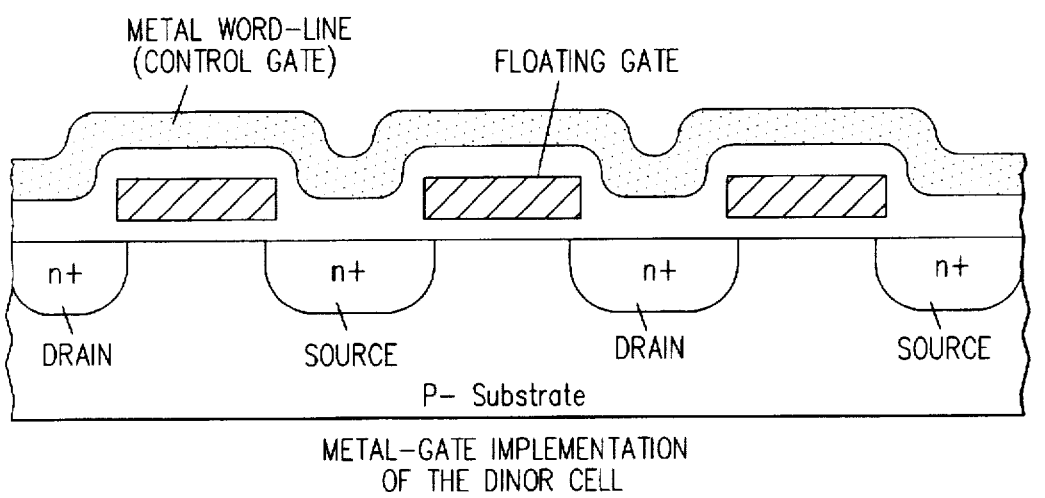

FIG. 4a shows the ETOX non-volatile memory cell and its program/erase/read table as well as the corresponding metal-gate implementation. FIG. 4b shows the split-gate memory cell and its program/erase/read table as well as the corresponding metal-gate implementation. FIG. 4c shows the double-poly source-side injection memory cell and its program/read/erase table as well as the corresponding metal-gate implementation. FIG. 4d shows the triple-poly source-side injection memory cell and its program/read/erase table as well as the corresponding metal-gate implementation. FIG. 4e shows the Divided Bitline NOR (DINOR) memory cell and its program/read/erase table as well as the corresponding metal-gate implementation.

As apparent from FIGS. 4a to 4e, due to the simplicity of the metal-gate memory cell concept, it may be applied to any non-volatile memory cell technology, i.e., EPROM, Flash EPROM, EEPROM, Flash EEPROM, NOVRAM, etc.

The above description of the present invention is intended to be illustrative and not limiting. The invention is further intended to include all variations and modifications falling within the scope of the appended claims.

I claim:

1. A metal-gate non-volatile memory cell, comprising:
 a source region and a drain region formed in a silicon substrate, said source and drain regions being separated by a channel region;
 a floating gate formed over but insulated from said channel region, wherein at least one of the edges of the floating gate is aligned with and used to define the corresponding edge of one of source and drain regions; and
 a control gate comprising a metal formed over but insulated from said floating gate,
 wherein prior to forming the control gate an anneal cycle is carried out to remove the defects of the source and drain regions.

2. Structure as in claim 1 wherein said floating gate is insulated from said channel region by a layer of tunnel oxide dielectric.

3. Structure as in claim 1 wherein said control gate is insulated from said floating gate by a composite layer of, in the order from bottom to top, HTO-nitride-HTO-polysilicon (ONOP) coupling dielectric.

4. Structure as in claim 1 wherein oxide spacers are formed on the sides of said floating gate.

5. Structure as in claim 1 wherein said metal comprises an alloy.

6. Structure as in claim 1 wherein said metal comprises aluminum.

7. Structure as in claim 1 wherein said metal comprises tungsten.

8. Structure as in claim 1 wherein said floating gate comprises polycrystalline silicon material.

9. Structure as in claim 1 wherein said non-volatile memory cell comprises a Flash EPROM cell.

10. Structure as in claim 1 wherein said non-volatile memory cell comprises an EPROM cell.

11. Structure as in claim 1 wherein said non-volatile memory cell comprises an EEPROM cell.

12. An array of metal-gate non-volatile memory cells formed in a silicon substrate, comprising:

a plurality of floating gates formed over but insulated from said silicon substrate, said floating gates being arranged along a plurality of lines running in a first direction across the array;

a plurality of continuous buried bitlines formed in said substrate separated by said lines of floating gates, whereby the portions of said buried bitlines adjacent to the edges of the floating gates form the source and drain regions of said metal-gate memory cells, the edges of the floating gates being aligned with and used to define the edges of the source and drain regions; and a plurality of control lines comprising a metal running over but insulated from said floating gates, said plurality of control lines running in a direction other than said first direction, whereby portions of each control line running directly over the memory cells form the control gate of the memory cells, wherein prior to forming the control lines an anneal cycle is carried out to remove the defects of the source and drain regions.

13. Structure as in claim 12 wherein said floating gates are insulated from said silicon substrate by a layer of tunnel oxide dielectric.

14. Structure as in claim 12 wherein said control lines are insulated from said floating gates by a composite layer of, in the order from bottom to top, HTO-Nitride-HTO-Polysilicon (ONOP) coupling dielectric.

15. Structure as in claim 12 wherein oxide spacers are formed on the sides of said plurality of floating gates adjacent to said buried bitlines.

16. Structure as in claim 12 wherein said metal comprises an alloy.

17. Structure as in claim 12 wherein said metal comprises aluminum.

18. Structure as in claim 12 wherein said metal comprises tungsten.

19. Structure as in claim 12 wherein said floating gate comprises polycrystalline silicon material.

* * * * *